US009847124B2

(12) United States Patent
Hu et al.

(10) Patent No.: US 9,847,124 B2
(45) Date of Patent: Dec. 19, 2017

(54) RESISTIVE ELEMENTS TO OPERATE AS A MATRIX OF PROBABILITIES

(71) Applicant: Hewlett Packard Enterprise Development LP, Houston, TX (US)

(72) Inventors: Miao Hu, Palo Alto, CA (US); John Paul Strachan, San Carlos, CA (US); Ning Ge, Palo Alto, CA (US); Jianhua Yang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,500

(22) PCT Filed: Apr. 23, 2015

(86) PCT No.: PCT/US2015/027284
§ 371 (c)(1),
(2) Date: Jan. 30, 2017

(87) PCT Pub. No.: WO2016/171697
PCT Pub. Date: Oct. 27, 2016

(65) Prior Publication Data
US 2017/0221560 A1    Aug. 3, 2017

(51) Int. Cl.
*G11C 13/00*    (2006.01)
*G06N 7/00*    (2006.01)
*G06F 17/18*    (2006.01)

(52) U.S. Cl.
CPC .......... *G11C 13/0021* (2013.01); *G06F 17/18* (2013.01); *G06N 7/005* (2013.01)

(58) Field of Classification Search
CPC .................................................. G11C 13/0021
(Continued)

(56) References Cited

U.S. PATENT DOCUMENTS 4,462,081 A * 7/1984 Lehan ..................... G06F 17/18
702/181
6,463,422 B1   10/2002 Hangartner
(Continued)

FOREIGN PATENT DOCUMENTS

| KR | 1020150034900 | 4/2015 |
| WO | WO-2012060807 | 5/2012 |
| WO | WO-2014018063 | 1/2014 |

OTHER PUBLICATIONS

Gale, E., et al., Beyond Markov Chains, Towards Adaptive Memristor Network—based Music Generation [online], Feb. 4, 2013, Retrieved Feb. 13, 2015, 22 Pgs.
(Continued)

*Primary Examiner* — Son Mai
(74) *Attorney, Agent, or Firm* — Hanley Flight & Zimmerman, LLC (57) ABSTRACT

An example apparatus includes a crossbar array of signal lines and control lines. The example apparatus also includes an input controller in circuit with the control lines. The input control is to select one of the control lines. The example apparatus also includes first resistive elements connected between corresponding ones of the control lines and corresponding ones of the signal lines. The first resistive elements have first conductances set to operate as a matrix of probabilities that define a fixed transition kernel of a Markov Chain. The example apparatus also includes second resistive elements in circuit with the signal lines. The second resistive elements have second conductances set to select one of the signal lines exclusive of others of the signal lines based on a subset of the probabilities in the matrix of the probabilities.

15 Claims, 7 Drawing Sheets

(58) Field of Classification Search
USPC .......................................................... 365/148
See application file for complete search history.

(56) References Cited

U.S. PATENT DOCUMENTS

| | | | |
|---|---|---|---|
| 9,009,095 | B1 | 4/2015 | Fafri et al. |
| 9,152,827 | B2 * | 10/2015 | Linderman .............. G06G 7/16 |
| 9,455,030 | B1 * | 9/2016 | Wu ....................... G11C 7/1006 |
| 9,715,926 | B2 * | 7/2017 | Cho ................... G11C 13/0069 |
| 2014/0068704 | A1 | 3/2014 | Grewal et al. |
| 2014/0172937 | A1 | 6/2014 | Linderman et al. |
| 2014/0208041 | A1 | 7/2014 | Hyde et al. |
| 2014/0324760 | A1 | 10/2014 | Marwah et al. |

OTHER PUBLICATIONS

International Searching Authority, The International Search Report and the Written Opinion, PCT/US2015/027284, dated Jan. 22, 2016, 9 Pages.

* cited by examiner

RESISTIVE ELEMENTS TO OPERATE AS A MATRIX OF PROBABILITIES

BACKGROUND

Hardware accelerators use hardware to perform functions (e.g., video encoding, digital signal processing, cryptology, etc.) often performed by software in a general-purpose processor. Traditionally, hardware accelerators are designed to replace frequently used, but computationally intensive, software code.

DETAILED DESCRIPTION

Examples disclosed herein may be used to implement a Markov Chain Monte Carlo (MCMC) machine using memristor arrays. A memristor is a passive electrical component having electrical properties that allow changing the resistive characteristics of the memristor. The changeable resistance enables the conductance of the memristor to be a configurable characteristic. Additionally, the electrical properties of a memristor can be set so the memristor operates as a stochastic switch. For example, as disclosed in detail below, the memristor can be set so that, under particular operating conditions, the memristor has a probability associated with transitioning from a non-conducting state (e.g., an open-circuit state) to a conducting state (e.g., a closed-circuit state).

The conductance of the memristor is configurable by applying different electrical currents or voltages across the memristor. For example, the conductance of the memristor can be configured (e.g., tuned) based on the magnitude and direction of the electrical current or voltage that is provided through the memristor. Additionally, a memristor is a non-volatile component because the memristor does not require power to maintain its set conductance.

A crossbar array includes a first group of conductive parallel paths (e.g., control lines) and a second group of conductive parallel paths (e.g., signal lines). Resistive elements (e.g., memristors) in the crossbar array connect between corresponding control lines and signal lines forming electrical paths of variable resistance, and thus, variable conductances. The crossbar array is configured such that, when a select voltage ($V_S$) is applied to a control line, an electrical potential is created between the selected control line and the signal lines through an interconnecting memristor. The electrical potential enables charge to flow from the signal lines to the selected control line according to the resistive characteristic set for the memristor.

Memristors that are set to operate as stochastic switches are configured to be in a flux condition. In the flux condition, the memristors are on the verge of switching from a non-conducting state (e.g., an open-circuit state, etc.) to a conducting state (e.g., a closed-circuit state, etc.). Changing electric charge on the memristor will cause the memristor to switch states. In the flux condition, a switching time for the memristor to switch states varies from one instance to the next under substantially identical conditions. For example, a memristor set into the flux condition may at one time transition from the non-conducting state to the conducting state in five nanoseconds, and at another time, under substantially identical conditions, transition in seven nanoseconds. The variance in the switch time is influenced by a rate of change of the electric charge on the memristor. For example, increasing the rate of change of the electric charge increases the likelihood that the memristor will transition from the non-conducting state to the conducting state with a shorter switching time. As another example, a first memristor in the flux condition experiencing a higher rate of change of the electric charge than a second memristor in the flux condition will likely switch before the second memristor. The rate of change of the electric charge is determined by the select voltage ($V_S$) applied to a selected signal line and the conductance of the corresponding resistive element (e.g., a memristor) in series with the memristor in the flux condition.

Markov Chain Monte Carlo machines may be implemented using software. In some examples, such software-based Markov Chain Monte Carlo machines are significantly computationally intensive requiring a large amount of processor resources. Examples disclosed herein may be used to configure resistive elements to operate as a matrix of probabilities to implement, for example, a Markov Chain Monte Carlo machine using memristor arrays which may be used to supplement and/or in place of computationally intensive software. A Markov Chain is a statistical tool used in many technical fields (e.g., physics, statistics, chemistry, computer science, etc.) to describe a sequence of events in which there is a probability associated with transitioning between different states. For a particular sequence of events of interests, a fixed transition kernel (T) defines the probabilities of transitioning from one state to the next. Equation 1 below illustrates an example fixed transition kernel (T).

$$T = \begin{bmatrix} P_{A,A} & P_{A,B} & \cdots & P_{A,N} \\ P_{B,A} & P_{B,B} & \cdots & P_{B,N} \\ \vdots & \vdots & \ddots & \vdots \\ P_{N,A} & P_{N,B} & \cdots & P_{N,N} \end{bmatrix} \quad \text{Equation 1}$$

For example, in Equation 1 above, if the current state is State A (noted in subscript form in Equation 1), the probability that the next state will be State B A (noted in subscript form in Equation 1) is represented by $P_{A,B}$. In a fixed transition kernel (T) such as the example fixed transition kernels (T) of FIGS. 1A, 1B, and 2, the value of any probability (P) is a non-negative number, and the summation of each row equals one. Some example fixed transition kernels (T) are irreducible and aperiodic. That is, a fixed transition kernel (T) is irreducible if, starting from any current state, given enough state transitions, the Markov Chain can transition all of its elements to a different state. A fixed transition kernel is aperiodic if state transitions do not get trapped in a cycle. Additionally, a Monte Carlo method is a tool that repeats random sampling to reach a numerical result in which, for example, a deterministic relationship between input conditions and output results cannot be established. As such, a Markov Chain Monte Carlo (MCMC) machine generates samples that approximate a target distribution of values defined by the fixed transition kernel (T).

Figure 1A:
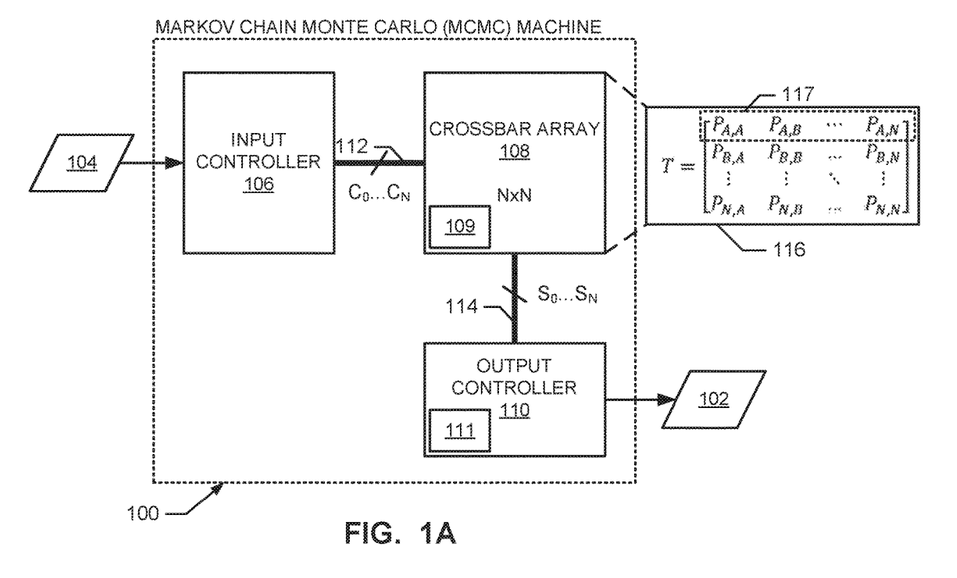
FIGS. 1A and 1B illustrate examples of a Markov Chain Monte Carlo (MCMC) machine implemented using a memristor array.
Figure 3:
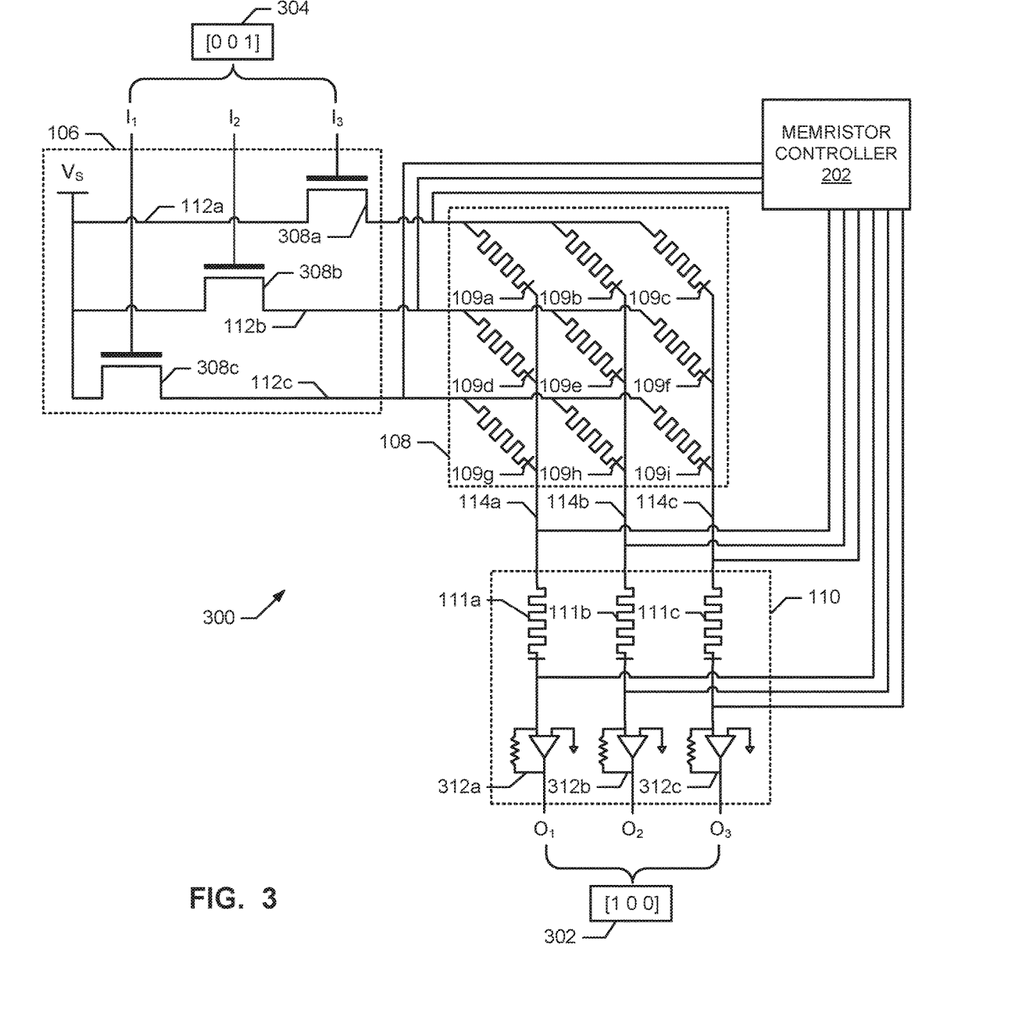
FIG. 3 illustrates an example hardware circuit implementing the MCMC machine(s) of FIGS. 1A, 1B, and/or 2.

FIG. 1A illustrates an example MCMC machine 100 to generate a sample next state 102 of a Markov Chain based on a current state 104 of the Markov Chain. In the illustrated example, an input controller 106 is in circuit with an example control line bus 112 of N control lines (e.g., control lines $C_0$ through $C_N$) that electrically connects the input controller 106 and a crossbar array 108. In the illustrated example, N is the number of possible states in the Markov Chain. The input controller 106 is used to select different ones of the control lines 112 at different times. The example crossbar array 108 includes first resistive elements 109 interconnected between corresponding ones of the control lines 112 and corresponding signal lines of a signal line bus 114. An example of such interconnections is shown in FIG. 3. The example first resistive elements 109 have first conductances set to operate as a matrix of probabilities 116 that define a fixed transition kernel of a Markov Chain.

Additionally, in the illustrated example, the signal line bus 114 of N signal lines (e.g., signal lines $S_0$ through $S_N$) connects the crossbar array 108 and the output controller 110. In the illustrated example of FIG. 1A, the output controller 110 includes second resistive elements 111 in circuit with the signal lines in the signal line bus 114. In the illustrated example, the second resistive elements 109 have second conductances set to select one of the signal lines 114 exclusive of others of the signal lines 114 based on a subset of probabilities 117 in the matrix of the probabilities 116. The example subset of the probabilities 117 is defined by first conductances of a subset of the first resistive elements 109 corresponding to a selected one of the control lines 112.

Figure 1B:
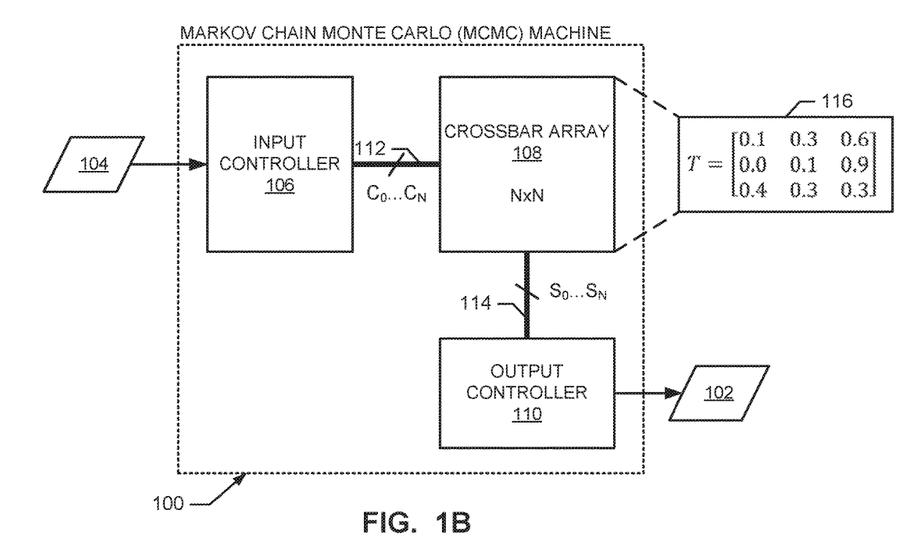

FIG. 1B illustrates an example MCMC machine 100 to generate the sample next state 102 of a Markov Chain based on the current state 104 of the Markov Chain. In the illustrated example of FIG. 1B, the first resistive elements 109 are not shown. In the illustrated example, the input control 106 receives and/or otherwise obtains (e.g., from a processor 612 of FIG. 6 below, etc.) the current state 104 to be used to generate the next state 102. Based on the received current state 102, the example input controller 106 selects one of the control lines in the control line bus 112 representative of the current state 102. In the illustrated example, the example crossbar array 108 is tuned to operate as an N×N matrix of probabilities 116 that define a fixed transition kernel (T) of the Markov Chain. The example matrix of probabilities 116 defines the probability that a next state 102 represented by a signal line will be selected based on a selection of a control line representative of the current state 104. In the illustrated example, a resistive element 109 in the crossbar array 108 corresponds to each of the probabilities in the matrix of probabilities 116. In the illustrated example, the output controller 110 outputs the next state 102 of the Markov Chain based on the one of the control lines 112 selected by the input controller 106 and the matrix of probabilities 116 of the crossbar array 108.

Figure 2:
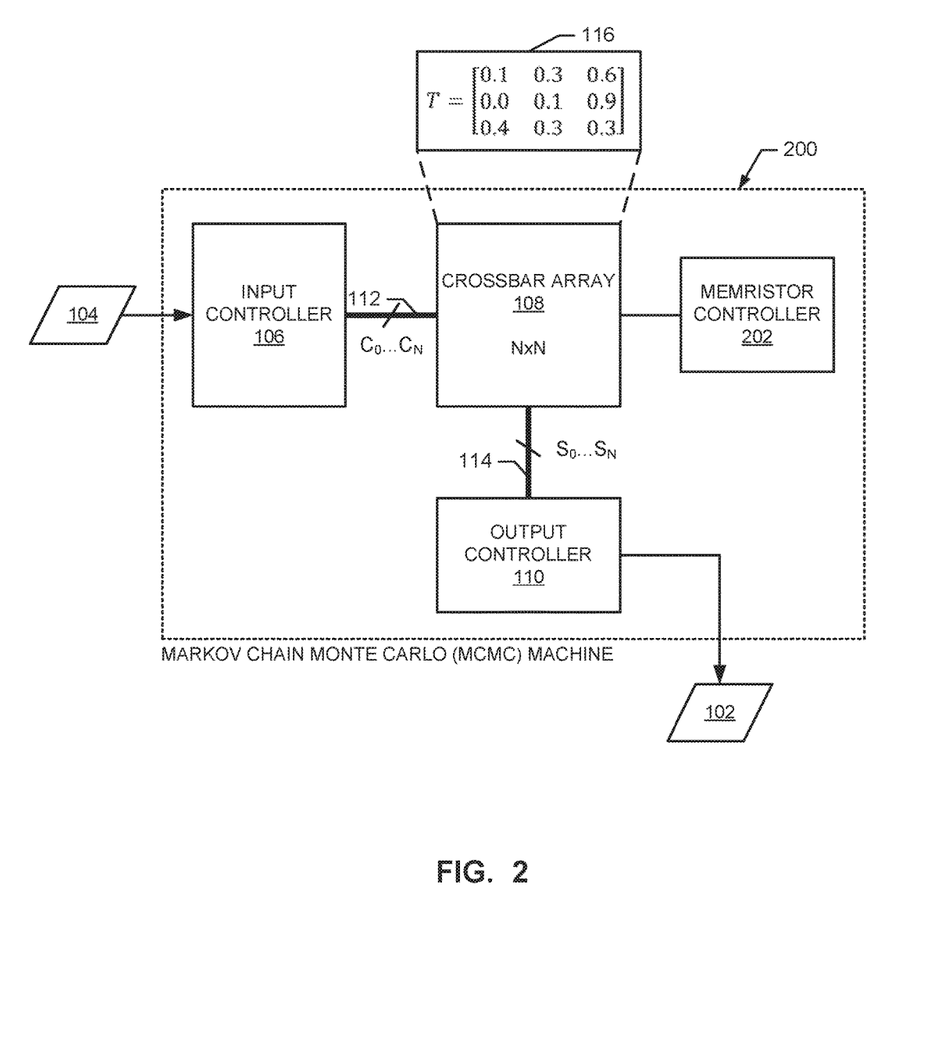
FIG. 2 illustrates another example of a MCMC machine implemented using a memristor array.

FIG. 2 illustrates an example MCMC machine 200 to determine the next state 102 of a Markov Chain based on the current state 104 of the Markov Chain. In the illustrated example, the MCMC machine 200 may change the matrix of probabilities 116 defining the fixed transition kernel by using an example memristor controller 202. The example memristor controller 202 is provided to tune conductances of resistive elements in the crossbar array 108. For example, the memristor controller 202 may apply voltages to one or more of the signal lines in the signal line bus 114 and voltages to the one or more control lines of control line bus 112 to increase and/or decrease the conductance of particular memristors in the crossbar array 108 by changing their resistance characteristics. For example, if the probability of a particular signal line in the signal line bus 114 being selected when a particular control line in the control line bus 112 is selected is lower than the a desired probability, the memristor controller 202 may increase the conductance of one of first resistive elements 109 (FIGS. 1A and 3) in the crossbar array 108 (e.g., by decreasing it resistance) corresponding to that particular signal line in the signal line bus 114 and the particular control line in the control line bus 112. Conversely, for example, if the probability of a particular signal line in the signal line bus 114 being selected when a particular control line in the control line bus 112 is selected is higher than the desired probability, the memristor controller 202 may decrease the conductance of one of the first resistive elements 109 (FIGS. 1A and 3) in the crossbar array 108 (e.g., by increasing its resistance) corresponding to that particular signal line in the signal line bus 114 and the particular control line in the control line bus 112.

FIG. 3 illustrates an example circuit 300 that may be used to implement the example MCMC machines 100, 200 of FIGS. 1A, 1B, and/or 2. More detailed representations of the example crossbar array 108, the control lines 112a-112c and the signal lines 114a-114c are shown in the example circuit 300. While three example control lines 112a-112c and three example signal lines 114a-114c are illustrated in FIG. 3, the example crossbar array 108 may have any number of control lines 112 and signal lines 114. The example crossbar array 108 also includes first resistive elements 109a-109i (e.g., the first resistive elements 109 of FIG. 1A) connected between corresponding ones of the control lines 112a-112c and corresponding ones of the signal lines 114a-114c. In the illustrated example, the first resistive elements 109a-109i have first conductances set (e.g., by the memristor controller 202) to operate as a matrix of probabilities (e.g., the matrix of probabilities 116 of FIGS. 1A, 1B, and 2) that define a fixed transition kernel (T) of a Markov Chain. In some examples, the first resistive elements 109a-109i are memristors. Alternatively, in some examples, first resistive elements 109a-109i may be any other suitable electrical component or element with changeable resistances (e.g., changeable conductances) that can represent values of probabilities in the matrix of probabilities 116.

The example circuit 300 includes the example input controller 106 in circuit with the example control lines 112a-112c. The example input controller 106 selects one of the control lines 112a-112c based on a current state (e.g., the current state 104 of FIGS. 1A, 1B, and 2) received or otherwise obtained by the input controller 106. In the illustrated example, the input controller 106 includes switching elements 308a-308c (e.g., MOSFET transistors, thin-film transistors, etc.) to enable or disable a conductive path between a select voltage ($V_S$) and the selected one of the control lines 112a-112c corresponding the selected one of the switching elements 308a-308c. In some examples, the input controller 106 receives or otherwise obtains an input 304 as a binary value representative of the current state 104 of the Markov Chain. In such examples, the input controller 106 translates the binary value into bits to select one of the control line 112a-112c (e.g., via one of the switching elements 308a-308c) specified by the input 304. For example, if the binary value represented in bit notation is 001 (e.g., a decimal value 1), the input controller 106 selects the first control line 112a because the first control line 112a is in circuit with the ones of the first resistive elements 109a-109c that represent the first subset of probabilities 117 (FIG. 1A) of the matrix of probabilities 116.

In the illustrated example of FIG. 3, the circuit 300 includes an output controller 110 to output an output 302 as a binary number that represents the next state 102 (FIGS. 1A, 1B, and 2) of the Markov Chain. The example output controller 110 includes example second resistive elements 111a-111c in circuit with corresponding ones of the signal lines 114a-114c. The example second resistive elements 111a-111c have second conductances set to cause one of the signal lines 114a-114c to output a high state (e.g., a high-level voltage) exclusive of others of the signal lines 114a-114c when one of the control lines 112a-112c is selected. In examples disclosed herein, causing one of the signal lines 114a-114c to output a high-level voltage is referred to as selecting one of the signal lines 114a-114c. In some examples, to select the one of the signal lines 114a-114c, a corresponding one of the second resistive elements 111a-111b switches from a first conductive state (e.g., a non-conducting state, an open circuit state, etc.) to a second conductive state (e.g., a conducting state, a closed-circuit state, etc.). For example, to select one of the signal lines 114a-114c, one of the second resistive elements 111a-111c allows current to flow on the corresponding signal line 114a-114c. In the illustrated example, the selection is based on the subset of the probabilities 117 in the matrix of the probabilities 116. In the illustrated example, the subset of the probabilities 117 is defined by a subset of the first conductances of ones of the first resistive elements 109a-109i that corresponds to the selected one of the control lines 112a-112c. For example, if the input controller 106, via a first switching element 308a, selects a first control line 112a, the subset of probabilities 117 is represented in the conductances of the first resistive elements 109a-109c corresponding to the first control line 112a. For example, the conductances of the first resistive elements 109a-109c may be configured by setting the resistive characteristics of the first resistive elements 109a-109c to the subset of the probabilities 117.

In some examples, the input control 106 provides a limited electrical current to the selected one of the control lines 112a-112c. In some such examples, electrical current is configured to prevent ones of the second resistive elements (e.g., the second resistive elements 111a, 111b shown as "0" in FIG. 3) corresponding to the others of the signal lines (e.g., the signal lines 114a, 114b) from switching from the first conducting state to the second conducting state after one of the second resistive element (e.g., the second resistive element 111c shown as "1" in FIG. 3) corresponding to the selected one of the signal lines (e.g., the signal line 114c) switches from the first conducting state (e.g., an output corresponding to binary value 0) to the second conducting state (e.g., an output corresponding to binary value 1).

In some examples, the output controller 110 includes current-to-voltage convertors 312a-312c in series with the second resistive elements 111a-111c. In some such examples, when one of the second resistive elements 111a-111c is in the conducting state, the corresponding current-to-voltage convertors 312a-312c output a voltage level indicative of a Boolean value (e.g., a binary one, a TRUE value, etc.). Conversely, when one of the second resistive elements 111a-111c is in the non-conducting state, the corresponding current-to-voltage convertors 312a-312c output a voltage level indicative of an opposite Boolean value (e.g., a binary zero, a FALSE value, etc.).

While an example manner of implementing the MCMC machines 100, 200 of FIGS. 1A, 1B, and 2 is illustrated in FIG. 3, one or more of the elements, processes and/or devices illustrated in FIG. 3 may be combined, divided, re-arranged, omitted, eliminated and/or implemented in any other way. Further, all or part of the example output controller 106, the example crossbar array 108, the example output controller 110, the example memristor controller 202 and/or, more generally, the example MCMC machines 100, 200 could be implemented by one or more analog circuits, programmable processor(s), application specific integrated circuit(s) (ASIC(s)), programmable logic device(s) (PLD(s)) and/or field programmable logic device(s) (FPLD(s)).

Figure 4:
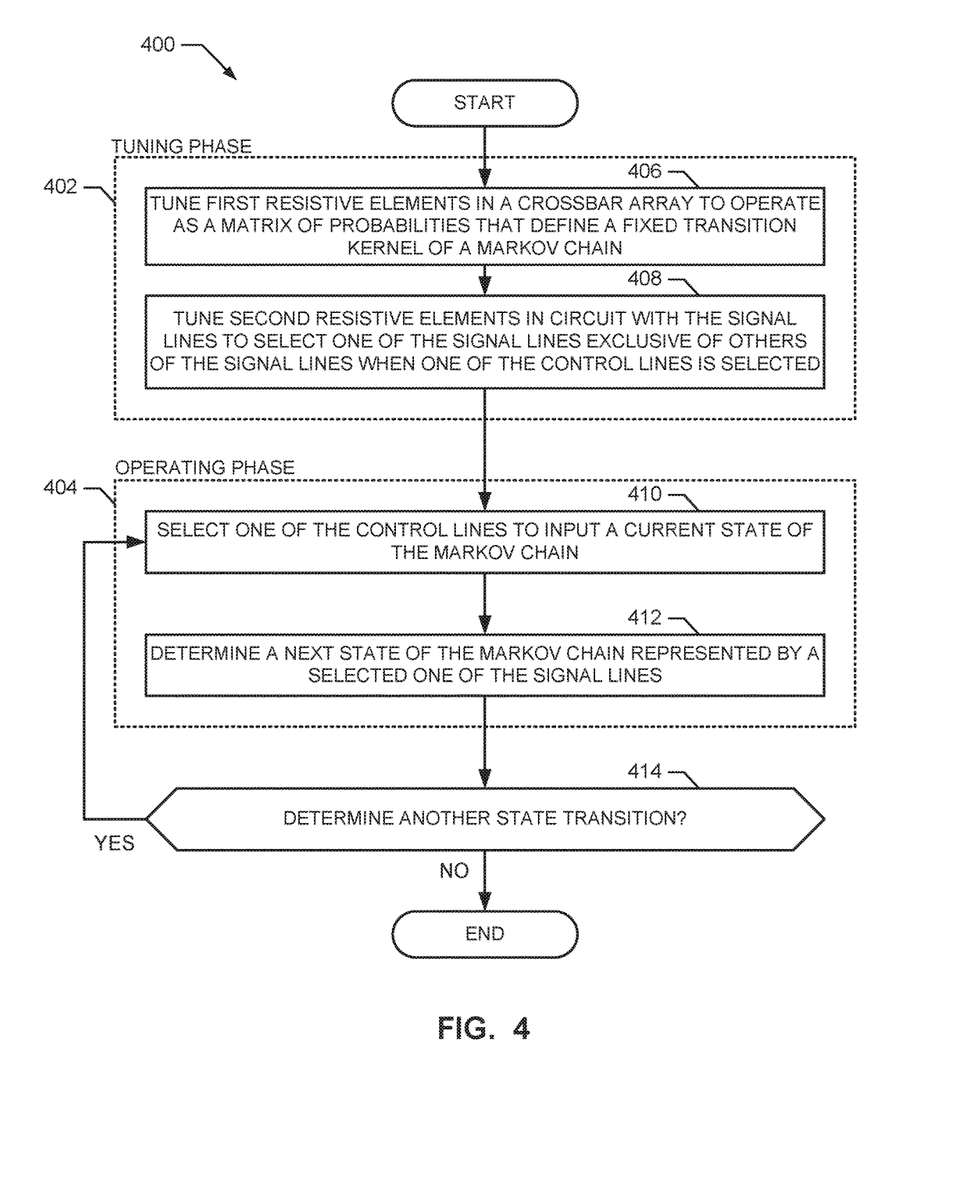
FIG. 4 depicts a flow diagram representative of an example process that may be used to implement the example MCMC machine(s) of FIGS. 1A, 1B, and/or 2, and the example hardware circuit of FIG. 3 to tune and operate the MCMC machines.
Figure 5:
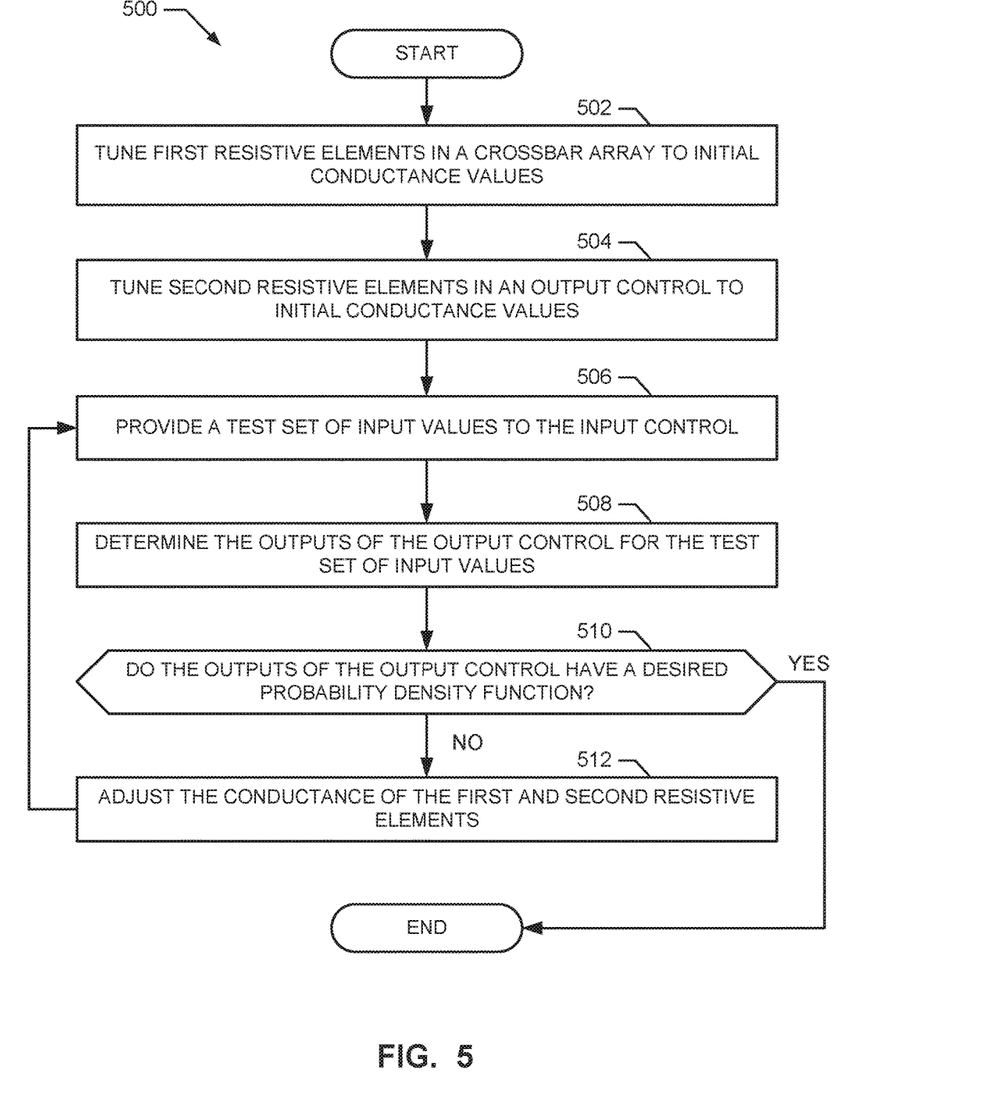
FIG. 5 depicts a flow diagram representative of an example process that may be used to implement the example MCMC machine(s) of FIGS. 1A, 1B, and/or 2, and/or the example hardware circuit of FIG. 3 to tune first resistive elements of a crossbar array of memristors to operate as a desired matrix of probabilities that define a fixed transition kernel of a Markov Chain.

Flowcharts representative of example machine readable instructions for implementing the example MCMC machines 100, 200 of FIGS. 1A, 1B, and 2, in combination with the example hardware circuit 300 of FIG. 3, are shown in FIGS. 4 and 5. In this example, the machine readable instructions include one or more programs for execution by a processor such as the processor 612 shown in the example processor platform 600 discussed below in connection with FIG. 6. The program(s) may be embodied in software stored on a tangible computer readable storage medium such as a CD-ROM, a floppy disk, a hard drive, a digital versatile disk (DVD), a Blu-ray disk, or a memory associated with the processor 612, but the entire program and/or parts thereof could alternatively be executed by a device other than the processor 612 and/or embodied in firmware or dedicated hardware. Further, although the example program is described with reference to the flowchart illustrated in FIGS. 4 and 5, many other methods of implementing the example MCMC machines 100, 200 may alternatively be used. For example, the order of execution of the blocks may be changed, and/or some of the blocks described may be changed, eliminated, or combined.

As mentioned above, the example processes of FIGS. 4 and 5 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 4 and 5 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 4 depicts a flow diagram representative of an example process 400 that may be used to implement the example MCMC machines 100, 200 of FIGS. 1A, 1B, and/or 2, and the hardware example circuit 300 of FIG. 3 to tune and operate the MCMC machines 100, 200. The example process 400 is shown in connection with two phases, namely an example tuning phase 402 and an example operating phase 404. The tuning phase 402 of the illustrated example is used to set the conductances of the first resistive elements 109a-109i (FIG. 3) to values indicative of probabilities in a matrix of probabilities (e.g., the matrix of probabilities 116 of FIGS. 1A, 1B and 2), and to tune the second resistive elements 111a-111c (FIG. 3) to operate as stochastic switches. The operating phase 404 of the illustrated example is used to input a current state 104 (FIGS. 1A, 1B, and 2) of a Markov Chain to determine a next state 102 (FIGS. 1A, 1B, and 2) of the Markov Chain.

Initially, at block 406 of the example tuning phase 402, the example memristor controller 202 (FIG. 2) tunes conductances of the first resistive elements 109a-109i connected between corresponding ones of the control lines (e.g., the control lines 112a-112c of FIG. 3) and corresponding ones of the signal lines (e.g., the signal lines 114a-114c of FIG. 3) to operate as a matrix of probabilities 116 that defines a fixed transition kernel of a Markov Chain. In some examples, the memristor controller 202 applies a first voltage to one of the control lines 112a-112c corresponding to one of the resistive elements 109a0109i to be tuned and a second voltage to one of the signal lines 114a-114c corresponding to the one or the resistive elements 109a-109i to be tuned to change the conductance of the particular one of the resistive elements 109a-109i.

At block 408, the example memristor controller 202 tunes conductances of second resistive elements 111a-111c in circuit with the signal lines 114a-114c. For example the example memristor controller 202 sets the second conductances of the second resistive elements 111a-111c to select one of the signal lines 114a-114c exclusive of others of the signal lines 114a-114c when one of the control lines 112a-112c is selected. The selection of one of the signal lines 114a-114c is based on a subset of the probabilities 117 (FIG. 1A) in the matrix of the probabilities 116. In some examples, the memristor controller 202 applies a first voltage of one terminal of one of the second resistive elements 111a-111c to be set and a second voltage to the other terminal of one of the second resistive elements 111a-111c to be set to change the conductance of the particular one of the second resistive elements 111a-111c into the flux condition.

During the example operating phase 404, at block 410, the example input controller 106 (FIGS. 1A, 1B, 2, and 3) provides a current state 104 (FIGS. 1A, 1B, and 2) of the Markov Chain at a first time by selecting one of the control lines 112a-112c, For example the input controller 106 provides the current states 104 as an input to the crossbar array 108. At block 412, the example output controller 110 (FIGS. 1A, 1B, 2, and 3) determines a next state 102 (FIGS. 1A, 1B, and 2) of the Markov Chain at a second time. The example next state 102 is represented by one of the signal lines 114a-114c being selected. For example, the next state 102 provided by the output controller 110 is generated based on probabilities represented by ones of the first resistive elements 109a-109i selected by the current state 104 provided by the input controller 106 at block 410. At block 414, the input controller 106 determines whether to another state transition is to be determined. If another state transition is to be determined, the example process 400 returns to block 410 to input another current state. Otherwise, if another state transition is not to be determined, the example process 400 ends.

FIG. 5 is a flow diagram representative of an example process 500 that may be used to implement the example MCMC machines 100, 200 of FIGS. 1A, 1B, and 2, and the hardware example circuit 300 of FIG. 3 to train the crossbar matrix 108 (FIGS. 1A, 1B, and 2) by tuning first resistive elements 109a-109i (FIG. 3) to operate as a desired matrix of probabilities 116 (FIGS. 1A, 1B, and 2) that define a fixed transition kernel (T) of a Markov Chain. Initially, at block 502, the memristor controller 202 (FIG. 2) tunes the first resistive elements 109a-109i in the crossbar array 108 (FIGS. 1A, 1B, 2, and 3). In the illustrated example, at block 504, the memristor controller 202 also tunes the second resistive elements 111a-111c to initial conductance values. In some examples, the memristor controller 202 tunes the first resistive elements 109a-109i without tuning the second resistive elements 111a-111c or tunes the second resistive elements 111a-111c without tuning the first resistive elements 109a-109i. At block 506, a processor 612 (FIG. 6) and/or memory 614, 616 (FIG. 6) provides a test set of input values (e.g., the input 304 of FIG. 3) to the input controller 106 (FIGS. 1A, 1B, 2, and 3). The example test set of input values causes the example input controller 106 to select each of the example control lines 112a-112c (FIG. 3) multiple times (e.g., hundreds of times, thousands of times, etc.) in order to determine whether the example first resistive elements 109a-109i are tuned to operate as the desired matrix of probabilities 116.

At block 508, the processor 612 and/or the memory 614, 616 determine(s) the outputs of the output controller 110 (FIGS. 1A, 1B, 2, and 3) for the test set of input values provided to the input controller 106 at block 506. At block 510, the processor 612 and/or the memory 614, 616 determine(s) whether the outputs of the output controller 110 determined at block 508 substantially match the desired matrix of probabilities 116. For example, for the desired matrix of probabilities 116, the desired output of selecting a first control line 112a may be: for 10% of the instances that the same inputs are provided, the output controller 110 selects a first signal line 114a, for 30% of the instances that the same inputs are provided, the output controller 110 selects a second signal line 114b, and for 60% of the instances that the same inputs are provided, the output controller 110 selects a third signal line 114c. In such an example, the example processor 612 and/or the example memory 614, 616 would compare to output of the output controller 106 determined at block 508 to the desired matrix of probabilities 116. If the outputs of the output controller 110 determined at block 508 do not substantially match the desired matrix of probabilities 116, the example process 500 advances to block 512. Otherwise, if the outputs of the output controller 110 determined at block 506 substantially match the desired matrix of probabilities 116, the example process 500 ends.

At block 512, the example memristor controller 202 adjusts the conductance of the first resistive elements 109a-109i that did not substantially match corresponding probabilities in the desired matrix of probabilities 116. As discussed above, the example first resistive elements 109a-109i in the crossbar array 108 correspond to particular probabilities in the desired matrix or probabilities 116. In some examples, if in the output determined at block 508, the probability of a particular signal line 114a-114c being selected when a particular control line 112a-112c was selected is low, the memristor controller 202 increases the conductance of the first resistive element 109a-109i corresponding to that particular signal line 114a-114c and that particular control line 112a-112c. Conversely, in some examples in which the probability of a particular signal line 114a-114c being selected when a particular control line 112a-112c was selected is high, the memristor controller 202 decreases the conductance of the first resistive element 109a-109i corresponding to that particular signal line 114a-114c and that particular control line 112a-112c. After adjusting the conductances of one or more of the first resistive elements 109a-109i, control of the example process 500 returns to block 506 to retest the MCMC machine 100, 200.

Figure 6:
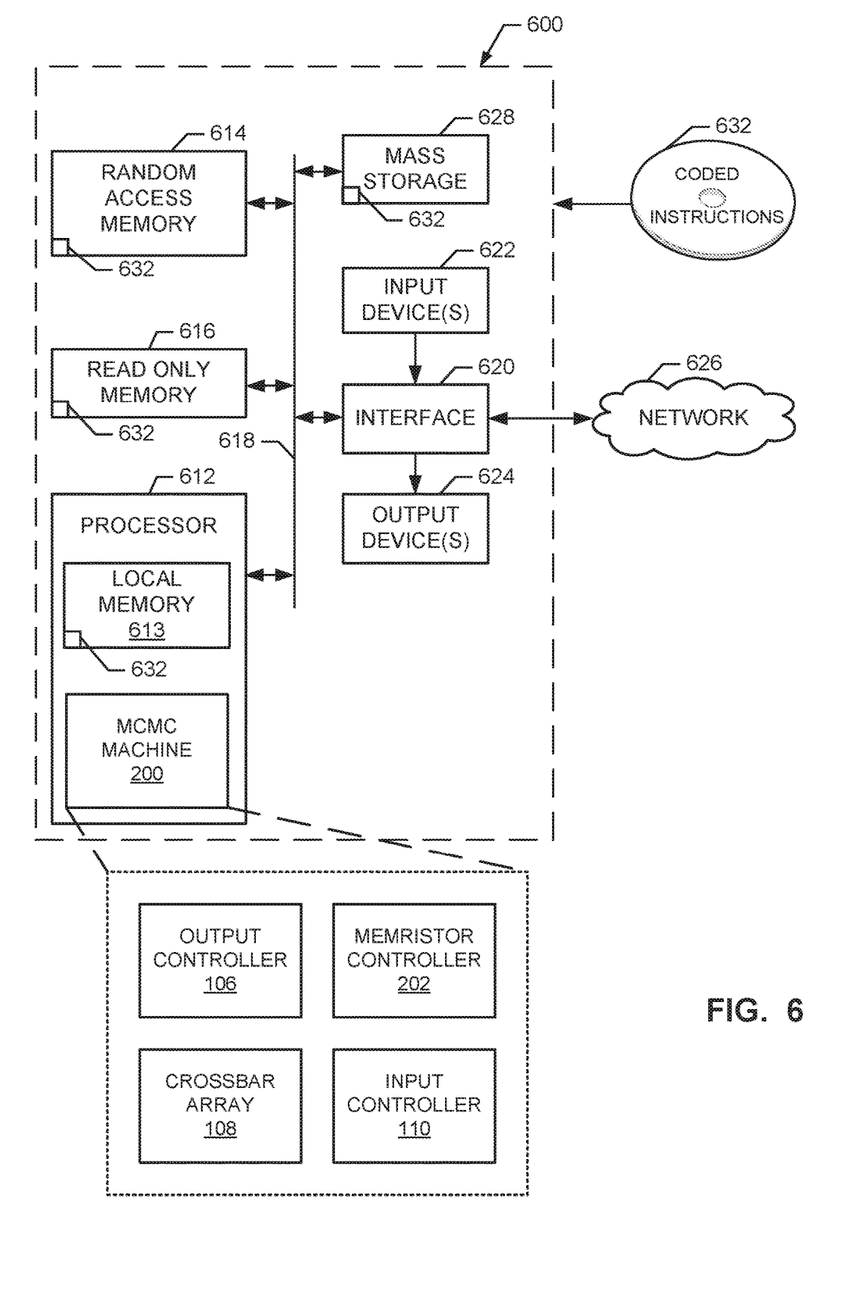
FIG. 6 is a block diagram of an example processor system structured to include the MCMC machine FIGS. 1A, 1B, 2, and 3, and/or execute the example machine readable instructions represented by FIGS. 4 and/or 5 to implement the example MCMC machine of FIGS. 1A, 1B, and/or 2, and the example hardware circuit of FIG. 3.

FIG. 6 is a block diagram of an example processor platform 600 structure to execute the processes 400, 500 of FIGS. 4 and 5 to implement the MCMC machines 100, 200 of FIGS. 1A, 1B, and 2, and the hardware circuit 300 of FIG. 3. The processor platform 600 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 600 of the illustrated example includes a processor 612. The processor 612 of the illustrated example is hardware. For example, the processor 612 can be implemented by one or more integrated circuits, logic circuits, microprocessors or controllers from any desired family or manufacturer. In the illustrated example, the MCMC machine 100, 200 is structured as part of the processor 612 (e.g., as part of an arithmetic logic unit of the processor 612, etc.). In some examples, the MCMC machine 100, 200 is structured as part of main memory 614, 616. In some examples the MCMC machine 100, 200 is a stand-alone component connected the processor 612 and/or the main memory 614, 616 via a bus 618.

The processor 612 of the illustrated example includes a local memory 613 (e.g., a cache). The processor 612 of the illustrated example is in communication with a main memory including a volatile memory 614 and a non-volatile memory 616 via the bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), and/or a PCI express interface.

In the illustrated example, one or more input devices 622 are connected to the interface circuit 620. The input device(s) 622 permit(s) a user to enter data and commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 624 are also connected to the interface circuit 620 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 620 of the illustrated example, thus, typically includes a graphics driver card, a graphics driver chip or a graphics driver processor.

The interface circuit 620 of the illustrated example also includes a communication device such as a transmitter, a receiver, a transceiver, a modem and/or network interface card to facilitate exchange of data with external machines (e.g., computing devices of any kind) via a network 626 (e.g., an Ethernet connection, a digital subscriber line (DSL), a telephone line, coaxial cable, a cellular telephone system, etc.).

The processor platform 600 of the illustrated example also includes one or more mass storage devices 628 for storing software and/or data. Examples of such mass storage devices 628 include floppy disk drives, hard drive disks, compact disk drives, Blu-ray disk drives, RAID systems, and digital versatile disk (DVD) drives.

Coded instructions 632 to implements the example processes 400, 500 of FIGS. 4 and 5 may be stored in the mass storage device 628, in the volatile memory 614, in the non-volatile memory 616, and/or on a removable tangible computer readable storage medium such as a CD or DVD.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
a crossbar array of signal lines and control lines;
an input controller in circuit with the control lines, the input controller to select one of the control lines;
first resistive elements connected between corresponding ones of the control lines and corresponding ones of the signal lines, the first resistive elements having first conductances set to operate as a matrix of probabilities that define a fixed transition kernel of a Markov Chain; and
second resistive elements in circuit with the signal lines, the second resistive elements having second conductances set to select one of the signal lines exclusive of others of the signal lines based on a subset of the probabilities in the matrix of the probabilities, the subset of the probabilities defined by a subset of the first conductances of ones of the first resistive elements corresponding to the selected control line.

2. An apparatus as defined in claim 1, wherein to select the one of the signal lines, the corresponding second resistive element switches from a first conductive state to a second conductive state.

3. An apparatus as defined in claim 2, wherein the input control is to provide an electrical current to the selected one of the control lines, the electrical current configured to prevent the second resistive elements corresponding to the others of the signal lines from switching from the first conducting state to the second conducting state after the second resistive element corresponding to the selected one of the signal lines switches from the first conducting state to the second conducting state.

4. An apparatus as defined in claim 1, wherein the input control is to select the one of the control lines at a first time to input a current state of the Markov Chain to the first resistive elements, and wherein the second conductances of the second resistive elements is to select the one of the signal lined to output a next state of the Markov Chain based on the input.

5. An apparatus as defined in claim 1, wherein the first resistive elements and the second resistive elements are memristors.

6. An article of manufacture including instructions that, when executed, cause a processor to at least:
tune first conductances of first memristor elements connected between corresponding ones of the control lines and corresponding ones of the signal lines to operate as a matrix of probabilities that defines a fixed transition kernel of a Markov Chain;
tune second conductances of second memristor elements in circuit with the signal lines, the second conductances set to select one of the signal lines exclusive of others of the signal lines when one of the control lines is selected based on a subset of the probabilities in the matrix of the probabilities;
input a current state of the Markov Chain at a first time by selecting one of the control lines; and
determine a next state of the Markov Chain at a second time that is generated based on the current state, the next state represented by one of the signal lines being selected.

7. An article of manufacture as defined in claim 6, wherein to select the one of the control lines, the instructions, when executed cause the processor to provide a current to the selected one of the control lines, the current configured to allow the second memristor element corresponding to the selected one of the signal lines to switch from a first conducting state to a second conducting state.

8. An article of manufacture as defined in claim 7, wherein the current is configured to prevent the second memristor elements corresponding to the others of the signal lines from switching from the first conducting state to the second conducting state after the second memristor element corresponding to the selected one of the signal lines switches from the first conducting state to the second conducting state.

9. An article of manufacture as defined in claim 6, after determining the next state of the Markov Chain, the instructions, when executed cause the processor to set the second memristor elements into the first conducting state.

10. An article of manufacture as defined in claim 6, wherein the subset of the probabilities is defined by a subset of the first conductances of ones of the first memristor elements corresponding to the selected control line.

11. An apparatus comprising:
a crossbar array of control lines and signal lines;
an input control in circuit with the control lines, the input control to select one of the control lines;
first resistive elements connected between corresponding ones of the control lines and corresponding ones of the signal lines; and
second resistive elements in circuit with the signal lines, the second resistive elements tuned in coordination with the first resistive elements by setting first conductances of the first resistive elements and second conductances of the second resistive elements, the tuning to set a probability that a particular one of the second resistive elements will, exclusive of others of the second resistive elements, conduct current.

12. An apparatus as defined in claim 11, wherein the probability is based on (i) the second conductances of the second resistive elements, and (ii) the first conductances of ones of first resistive elements corresponding to the selected control line.

13. An apparatus as defined in claim 11, wherein the input control provides a voltage to the selected one of the control lines, the voltage to cause the remaining ones of the second resistive elements to not conduct the current when the particular one of the second resistive elements conducts the current.

14. An apparatus as defined in claim 11, wherein the first resistive elements are tuned to represent a matrix of probabilities including the probability that the particular one of the second resistive elements will conduct the current, the matrix of probabilities representative of a fixed transition kernel of a Markov chain Monte Carlo machine.

15. An apparatus as defined in claim 11, wherein the first resistive elements and the second resistive elements are memristors.

* * * * *